United States Patent
Nichols et al.

(10) Patent No.: US 9,896,029 B1
(45) Date of Patent: Feb. 20, 2018

(54) VEHICLE COMPONENTS UTILIZING DETECTABLE LAYERS

(71) Applicant: Ford Global Technologies, LLC, Dearborn, MI (US)

(72) Inventors: Mark Edward Nichols, Washtenaw, MI (US); James Robert Mcbride, Saline, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/219,811

(22) Filed: Jul. 26, 2016

(51) Int. Cl.
| | | |
|---|---|---|
| *B60Q 1/56* | (2006.01) | |
| *B60Q 1/26* | (2006.01) | |
| *G02B 5/20* | (2006.01) | |
| *F21K 2/00* | (2006.01) | |
| *F21V 9/16* | (2006.01) | |
| *F21V 15/01* | (2006.01) | |
| *C23C 16/44* | (2006.01) | |
| *C23C 14/34* | (2006.01) | |

(52) U.S. Cl.
CPC .............. *B60Q 1/56* (2013.01); *B60Q 1/26* (2013.01); *C23C 14/34* (2013.01); *C23C 16/44* (2013.01); *F21K 2/005* (2013.01); *F21V 9/16* (2013.01); *F21V 15/01* (2013.01); *G02B 5/208* (2013.01)

(58) Field of Classification Search
CPC .. B60Q 1/56; B60Q 1/26; C23C 14/34; C23C 16/44; F21K 2/005; F21V 9/16; F21V 15/01; G02B 5/208
See application file for complete search history.

(56) References Cited

U.S. PATENT DOCUMENTS

| | | | |
|---|---|---|---|
| 4,916,014 A | 4/1990 | Weber et al. | |
| 6,997,981 B1 | 2/2006 | Coombs et al. | |
| 7,244,049 B2* | 7/2007 | Suzuki | F21S 48/1136 362/293 |
| 7,709,095 B2 | 5/2010 | Persoone et al. | |
| 9,096,442 B2 | 8/2015 | White et al. | |
| 2003/0016368 A1* | 1/2003 | Aman | G02B 5/128 356/615 |
| 2004/0032658 A1* | 2/2004 | Fleming | B32B 17/10 359/489.15 |
| 2007/0008735 A1* | 1/2007 | Harter, Jr. | F21S 48/1388 362/510 |
| 2008/0107841 A1 | 5/2008 | Remillard et al. | |
| 2008/0187708 A1 | 8/2008 | Decker et al. | |
| 2009/0193694 A1* | 8/2009 | Cordell | B60R 13/105 40/201 |
| 2009/0233121 A1 | 9/2009 | Leconte | |
| 2010/0151213 A1* | 6/2010 | Smithson | B60R 13/10 428/195.1 |

(Continued)

FOREIGN PATENT DOCUMENTS

| | | |
|---|---|---|
| DE | 10044375 B4 | 6/2006 |
| DE | 1020013216946 A1 | 6/2014 |

*Primary Examiner* — Marcus Taningco
(74) *Attorney, Agent, or Firm* — Jason Rogers; Price Heneveld LLP

(57) ABSTRACT

A vehicle is provided that includes an external body panel that includes a license plate positioned on the external body panel. A lighting assembly is disposed on the vehicle and a detectable layer is disposed on at least one of the license plate and the lighting assembly. The detectable layer is configured to reflect at least one band of the electromagnetic spectrum.

17 Claims, 6 Drawing Sheets

(56) References Cited

U.S. PATENT DOCUMENTS

| | | |
|---|---|---|
| 2011/0041726 A1 | 2/2011 | Robb et al. |
| 2012/0009416 A1 | 1/2012 | Lai et al. |
| 2013/0015977 A1* | 1/2013 | Scott ................. G01S 17/74 340/600 |
| 2014/0131990 A1* | 5/2014 | Zolotukhin ........... G03H 1/00 283/86 |
| 2014/0185155 A1 | 7/2014 | Lee et al. |
| 2014/0285889 A1* | 9/2014 | Smithson ............. B60R 13/10 359/530 |
| 2015/0167917 A1* | 6/2015 | Takahashi ........... F21S 48/22 362/520 |
| 2015/0247040 A1 | 9/2015 | Henglein et al. |
| 2015/0323149 A1* | 11/2015 | Salter ................. B60Q 1/26 362/510 |
| 2016/0017151 A1 | 1/2016 | Protzmann et al. |
| 2016/0132705 A1 | 5/2016 | Kovarik et al. |
| 2016/0146926 A1* | 5/2016 | Jungwirth ............ G01S 7/48 356/5.01 |

* cited by examiner

US 9,896,029 B1

VEHICLE COMPONENTS UTILIZING DETECTABLE LAYERS

FIELD OF THE INVENTION

The present disclosure generally relates to infrared detectable layers, and more particularly, to exterior vehicle components having infrared detectable layers disposed thereon.

BACKGROUND OF THE INVENTION

Autonomous vehicles sense the world around them using a variety of sensors. One such sensor may include a light detection and ranging (LIDAR) system that measures distance by illuminating a target with laser light. Such laser light may exist in the near-infrared and/or infrared wavelength band of the electromagnetic spectrum. In instances where the intended target has a high absorption, or low reflectance, of the wavelength used by the LIDAR system, detection of targets may prove difficult due to the lack of returned light from the target.

SUMMARY OF THE INVENTION

According to one aspect of the present disclosure, a vehicle is provided that includes a license plate positioned on the vehicle. A lighting assembly is positioned on the vehicle and a detectable layer is positioned on at least one of the license plate and the lighting assembly. The detectable layer is configured to reflect at least one band of the electromagnetic spectrum.

According to another aspect of the present disclosure, a vehicle is provided that includes a lighting assembly with a light source and a housing. The light source is positioned within the housing and is configured to emit light through the housing and a detectable layer is positioned on the housing. The detectable layer is configured to reflect near-infrared light.

According to yet another aspect of the present disclosure, a vehicle is provided that includes an exterior component and a detectable layer disposed on the exterior component. The detection is configured to fluoresce near-infrared light in response to an excitation emission.

These and other aspects, objects, and features of the present disclosure will be understood and appreciated by those skilled in the art upon studying the following specification, claims, and appended drawings. It will also be understood that features of each embodiment disclosed herein may be used in conjunction with, or as a replacement for, features of the other embodiments.

DETAILED DESCRIPTION OF THE PREFERRED EMBODIMENTS

Figure 1:
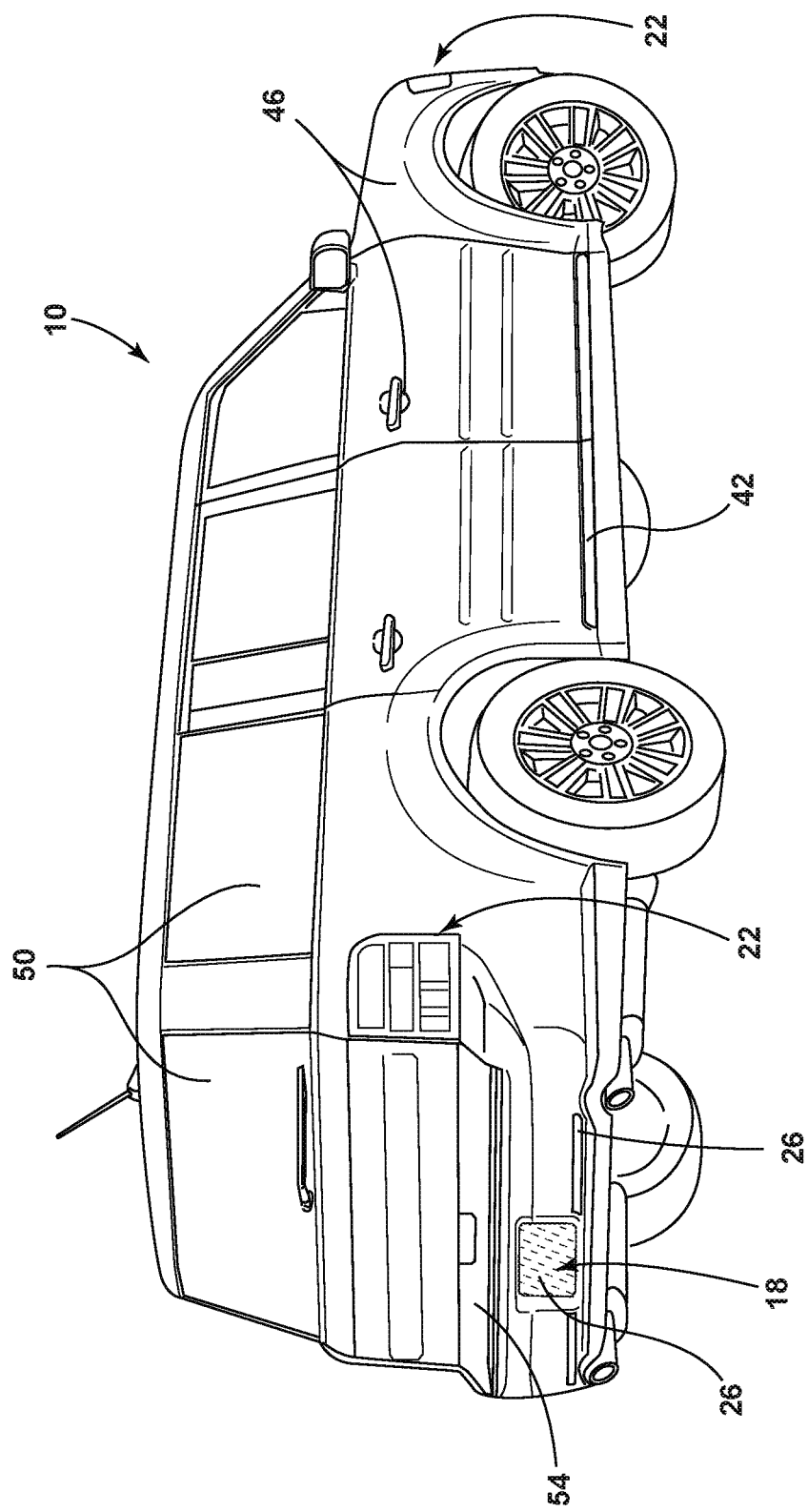
FIG. 1 is a rear-perspective view of a vehicle having a light assembly, according to one embodiment.

For purposes of description herein, the terms "upper," "lower," "right," "left," "rear," "front," "vertical," "horizontal," and derivatives thereof, shall relate to the disclosure as oriented in FIG. 1. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring now to FIGS. 1-3B, reference numeral 10 generally designates a vehicle. The vehicle 10 includes a component shown as a license plate 18 in one embodiment. A lighting assembly 22 is disposed on the vehicle 10. A detectable layer 26 is disposed on one or more external components of the vehicle 10. The detectable layer 26 is configured to interact with at least one band of the electromagnetic spectrum.

Referring now to FIG. 1, the vehicle 10 in the depicted example is a car, but it will be understood that the disclosure may equally be applied to trucks, vans, motorcycles, construction equipment and the like without departing from the teachings provided herein. The vehicle 10 includes a plurality of external components such as the license plate 18, the external body panel 14, the lighting assembly 22, a rear quarter panel 42, door panels 46, windows 50, a bumper 54, as well as other exterior structures and surfaces on the exterior of the vehicle 10.

Disposed on one or more of the external components of the vehicle 10 is the detectable layer 26. The detectable layer 26 is configured to interact (e.g., reflect, fluoresce, absorb) with one or more wavelength bands of the electromagnetic spectrum. According to one example, the detectable layer 26 is configured to allow detection of the vehicle 10 by LIDAR systems by reflecting and/or emitting light having a wavelength detectable by the LIDAR systems. According to various examples, the detectable layer 26 is configured to reflect, absorb and/or fluoresce light in the infrared band (e.g., light having a wavelength of between about 700 nm to about 1 mm) of the electromagnetic spectrum, and more particularly, the near infrared band (e.g., light having a wavelength of between about 700 nm to about 1400 nm). LIDAR systems may utilize lasers or light emission sources which emit light having a wavelength of about 905 and/or 1550 nm. In reflective examples of the detectable layer 26, the detectable layer 26 may be configured to reflect equal to or greater than about 10%, 20%, 30%, 40%, 50%, 60%, 70%, 80%, 90% or 99% of light (e.g., of the near-infrared band) falling on the detectable layer 26. The detectable layer 26 may be partially, substantially or fully transparent to light within the visible wavelength band of light (e.g., light having a wavelength of between about 390 nm to about 700 nm). For example, the detectable layer 26 may have a transparency to light in the visible wavelength band equal to or greater than about 10%, 20%, 30%, 40%, 50%, 60%, 70%, 80%, 90% or 99%. It will be understood that the detectable layer 26 may be configured as a coating, film, additional substrate, veneer, glaze, layer and/or covering without departing from the spirit of this disclosure.

Figure 2A:
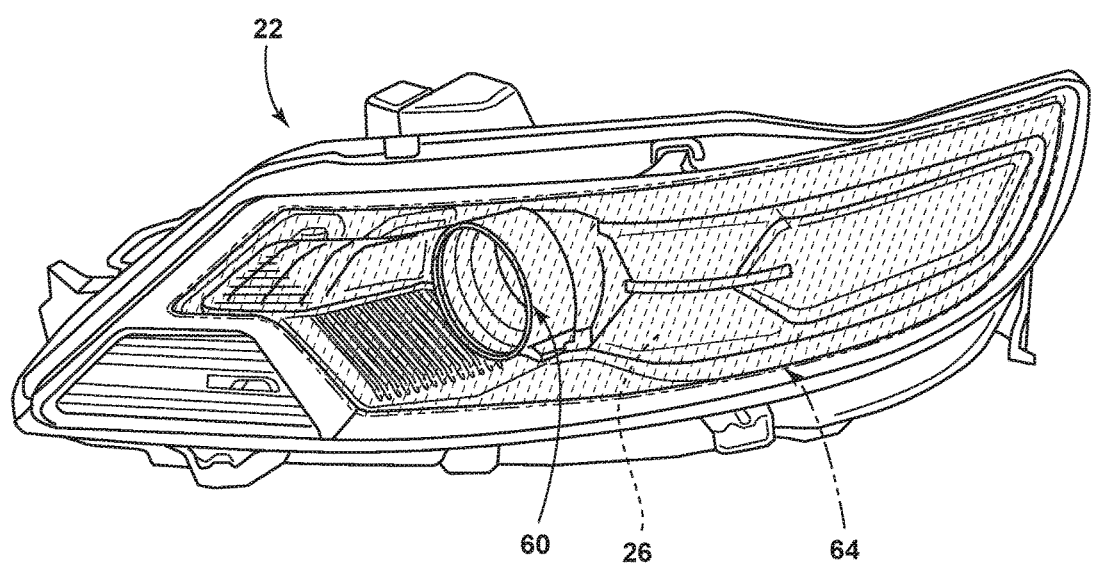
FIG. 2A is front-perspective view of the light assembly, according to one embodiment.

Referring now to FIG. 2A, the light assembly 22 includes a light source 60 disposed within a housing 64, or lens, which is substantially transparent. The light source 60 is configured to project light through the housing 64. In the depicted example, the detectable layer 26 is positioned on an exterior surface of the housing 64, but may additionally or alternatively be positioned on an interior surface of the housing 64. The detectable layer 26 may fully cover the housing 64, or may be applied in a striped, stippled or other pattern. As the detectable layer 26 may be transparent to light, the light emitted from the light source 60 may be transmitted through the detectable layer 26 without substantially impeding the use of the light source 60 while still allowing a LIDAR system to detect the presence of the vehicle 10 (e.g., by sensing the presence of the light assembly 22). It will be understood that although shown as a headlight, the foregoing description may equally be applied to tail lights, center high mount lights (CHMSL), turn indicators, running lights, fog lamps, license plate lamps and other light assemblies 22 positioned around the vehicle 10.

Figure 2B:
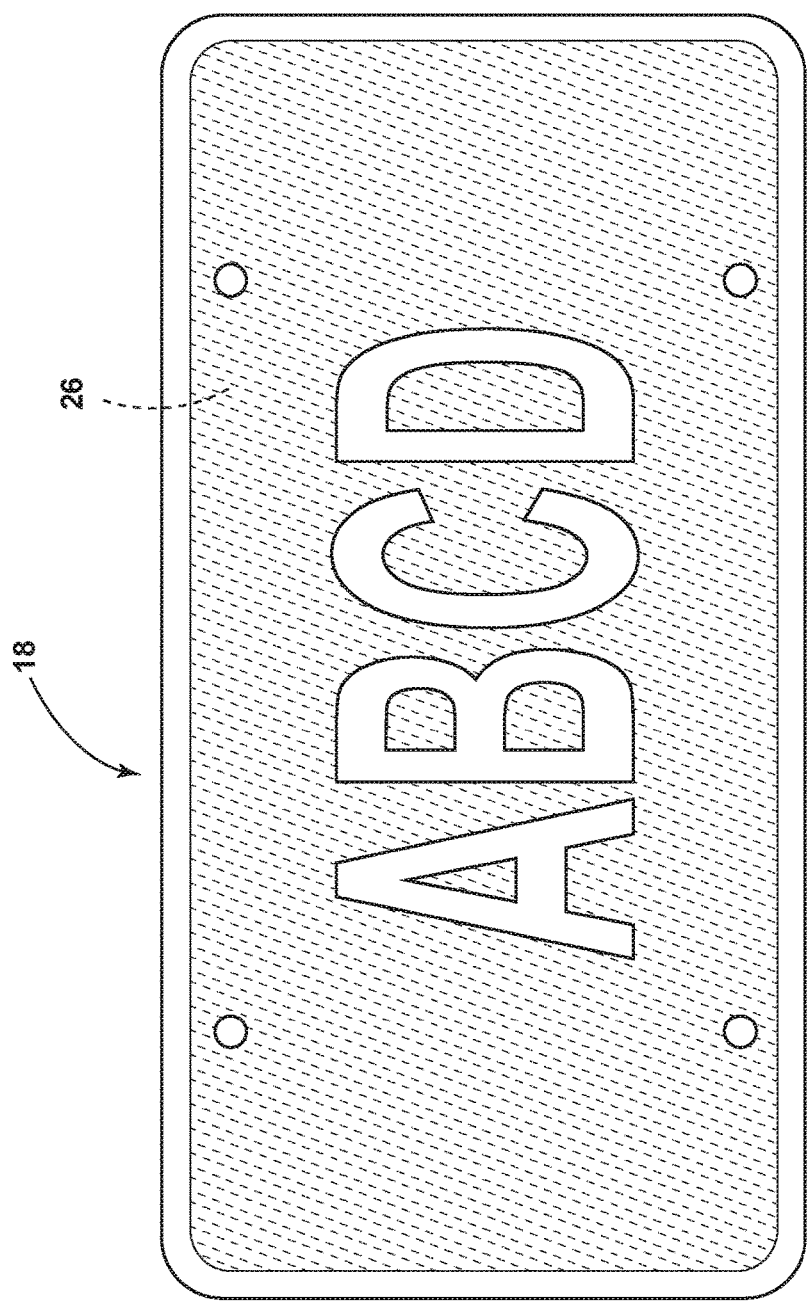
FIG. 2B is a front elevational view of a license plate illuminated with the light assembly, according to one example.

Referring now to FIG. 2B, as explained above, the license plate 18 may have the detectable layer 26 disposed thereon. The detectable layer 26 may be applied to cover the license plate 18 or may be applied in a striped, stippled or other pattern. The detectable layer 26 may cover lettering or indicia of the license plate 18 or may not. In yet other examples, the detectable layer 26 may be directly incorporated into paints, inks or dyes used on the license plate 18. Further, stickers present on the license plate 18 (e.g., registration tags), may have disposed on, or incorporated therein, the detectable layer 26.

Figure 3A:
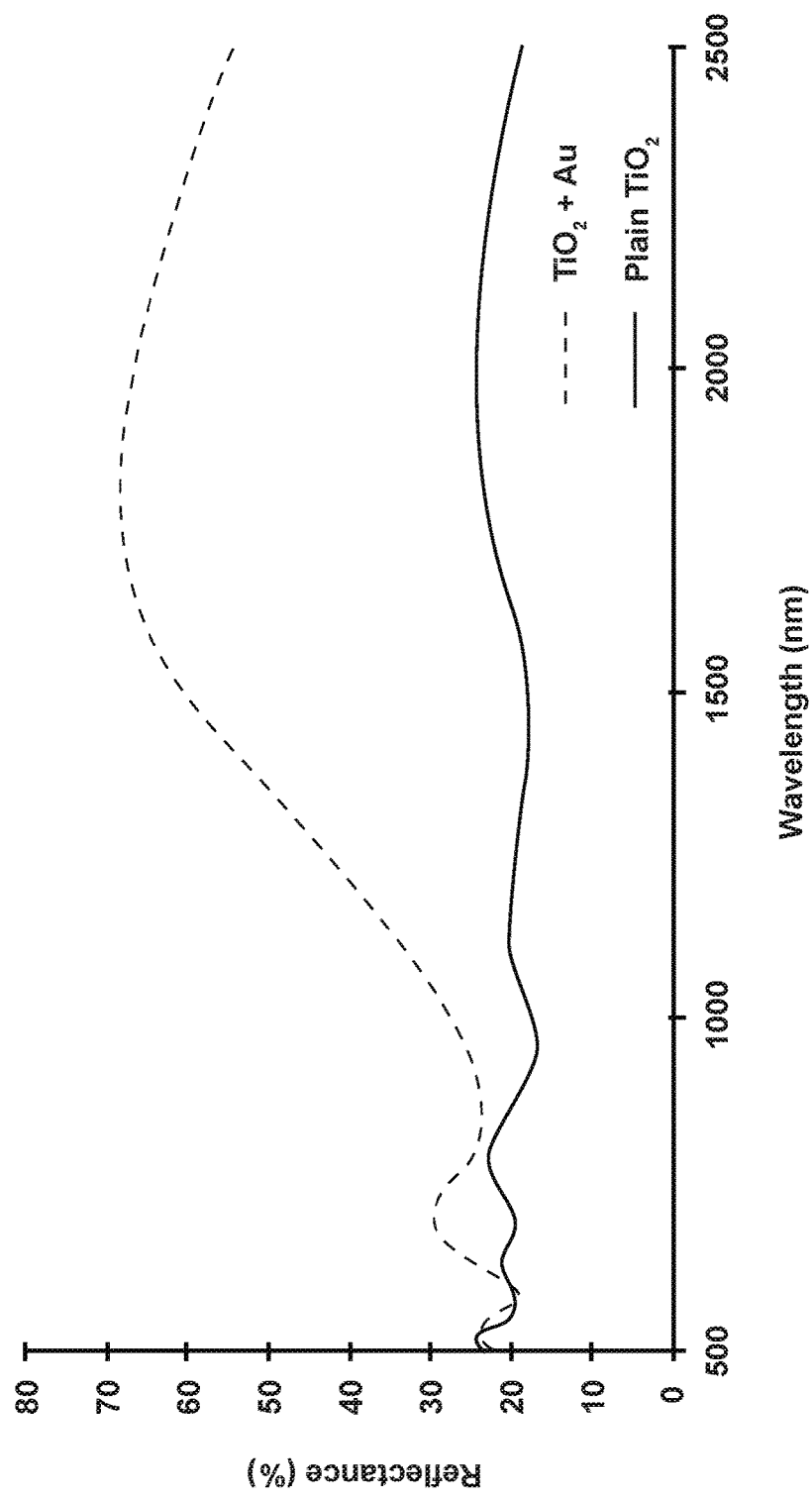
FIG. 3A is a graph depicting reflectance vs. wavelength for $TiO_2$ and gold doped $TiO_2$.

According to a first reflective example of the detectable layer 26, the detectable layer 26 is configured as a plurality of particles (e.g., a reflective component) or pigments disposed in a coating. The particles or pigments may be configured to selectively reflect radiation at one wavelength, but are transparent at other wavelengths as explained above. The particles may include a dielectric material. In a specific example, the dielectric particles may include $TiO_2$. According to some examples, the dielectric particles may include one or more dopants disposed within a matrix of the dielectric particles. The dopants may include metals selected from the group consisting essentially of gold, niobium, copper or combinations thereof. The dopants may be present within the dielectric particles at a concentration of less than about 5%, 4%, 3%, 2%, 1% or less than about 0.1%. Use of the dopants within the dielectric particles may increase the reflectivity of the dielectric particles at 1550 nm from about 30% to 65%. For example, FIG. 3A, depicts the reflectance vs. wavelength of undoped $TiO_2$ sample and a gold doped $TiO_2$ sample (e.g., the detectable layer 26). As can be seen, the reflectivity of the gold doped $TiO_2$ sample is increased relative to that of the undoped sample. In examples where the detectable layer 26 is positioned on a body panel of the vehicle 10, such as the door panels 46, rear quarter panel 42 and/or bumper 54, the particles may be integrated into a clear coat disposed over a paint layer of the body panel. In examples where the detectable layer 26 is disposed on the windows 50, light assembly 22, license plate 18 or other surfaces where it would be desirable to see through, the particles may be disposed within a transparent binder material such a silicone, acrylic, polyurethane, optically transparent or translucent polymer or the like. The particles may have a volume fraction within the clear coat and/or binder of between about 0.5% and about 20%, or between about 1% and about 10%, or between about 4% and about 6%. In a specific example, the particles may have a volume fraction within the clear coat and/or binder of about 5%.

According to a second reflective example of the detectable layer 26, the detectable layer 26 may include a stack of thin layers of materials with different refractive indices (e.g., a high refractive index material and a low refractive index material) on top of each other (e.g., a first material layer and a second material layer). In a specific example, the thin layers of material may be dielectrics. The thin layers of material may be arranged in a dielectric stack (i.e., a grouping of the first and second material layers based on physical properties). The detectable layer 26 may have one, two or more stacks of the first and second dielectric layers, each stack varying properties such as thickness and refractive index of the layers. This example of the detectable layer 26 may be referred to as a dielectric mirror. Using such an example, the wavelength at which the detectable layer 26 is reflective can be tuned by varying the thickness and composition of the alternating layers of high and low refractive index materials. The sharpness of the reflectivity window (i.e., a wavelength band at which the detectable layer 26 is reflective) can be controlled by the number of layers present in the detectable layer 26. Exemplary dielectric materials include $SiO_2$, $Ta_2O_5$, $NbO_5$, $TiO_2$, $HfO_2$, $MgF_2$ and combinations thereof. The thickness of the dielectric layers may each be between about 5 nm and about 200 nm. In some examples, the thickness of the dielectric layers may be different than one another and may vary. In some examples, the choice of which dielectric material to use may be based on the refractive index of the material in order to increase or decrease the reflectivity of the detectable layer 26. In various examples, high refractive index materials may have indices greater than about 1.9, greater than about 2.1, or greater than about 2.4. In various examples, low index of refraction materials may have refractive indices of less than about 1.5, less than about 1.4, or less than about 1.3.

Figure 3B:
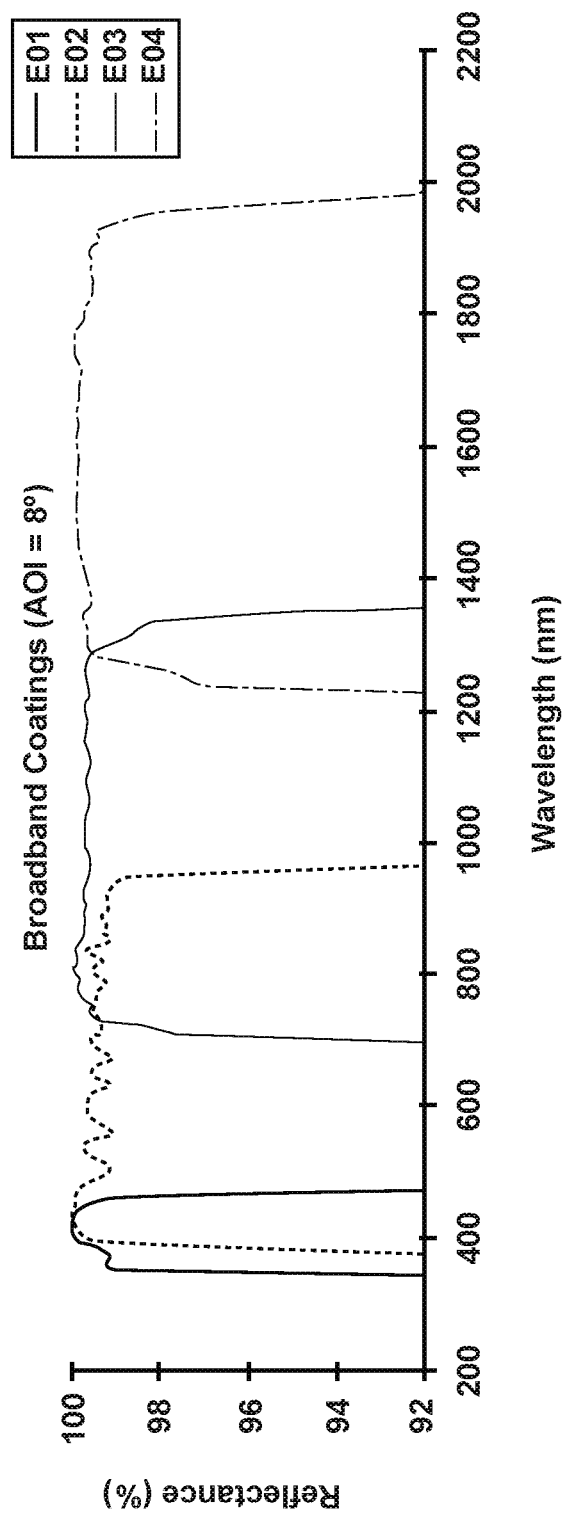
FIG. 3B is a graph depicting reflectance vs. wavelength for a reflective example of a detectable layer, according to one example.
Figure 4A:
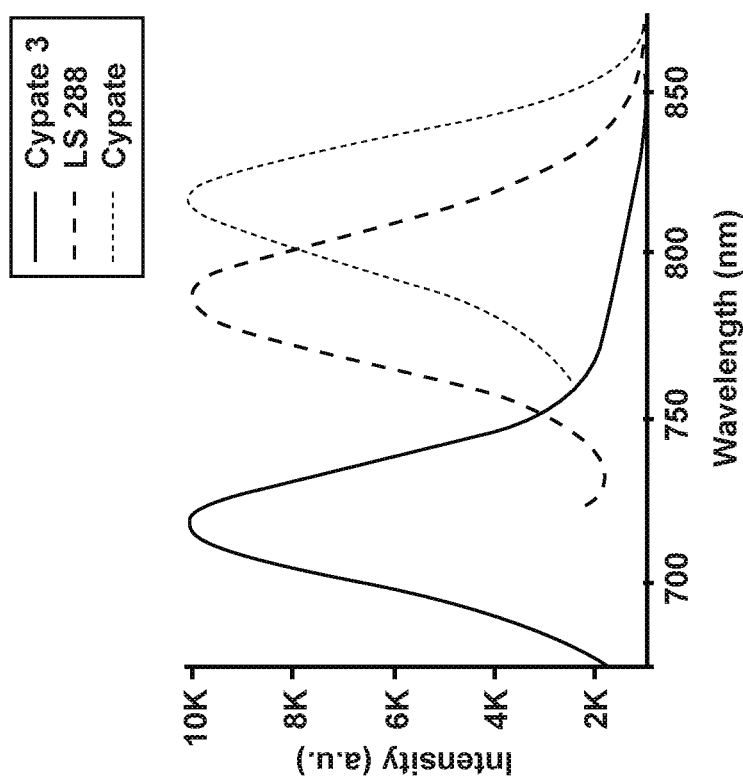
FIG. 4A is a graph depicting a wavelength vs. intensity for an excitation source.
Figure 4B:
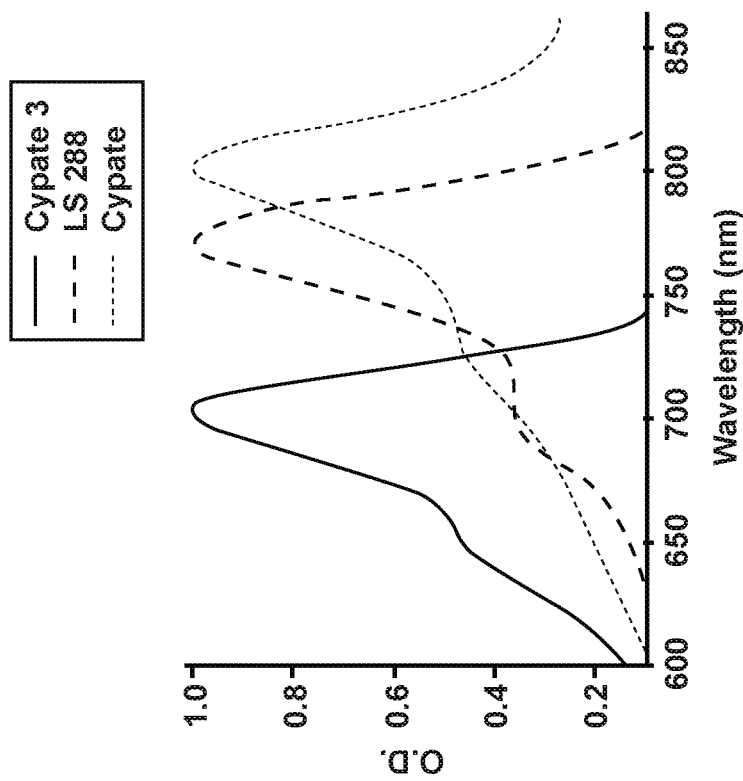
FIG. 4B is a graph depicting the intensity of a fluorescence from a detectable layer when illuminated with the excitation source.

In examples of the detectable layer 26 utilizing the alternating stack of high and low refractive index materials, the stack of high and low refractive index materials may be configured as a plurality of particles (e.g., the reflective component) disposed within in a clear coat and/or binder, as explained above in connection with the first example of the detectable layer 26. The stacks of alternating thin layers of materials with different refractive indices may be formed by thin film deposition. The stacks can be deposited by pyrolytic vapor deposition, chemical vapor deposition, sputtering or layer-by-layer (LBL) deposition. The stacks of alternating thin layers of materials may be produced by creating the thin films on flexible substrates, releasing the films from the substrate, and grinding the material into small flakes or particles for dispersion in binders and coatings, as explained above in connection with the first example of the detectable layer 26. The particles may have a volume fraction within the clear coat and/or binder of between about 0.5% and about 20%, or between about 1% and about 10%, or between about 4% and about 6%. In a specific example, the particles may have a volume fraction within the clear coat and/or binder of about 5%. As shown in FIG. 3B, the detectable layer 26 utilizing the stacks of alternating materials may be configured to reflect certain windows of the electromagnetic spectrum while being substantially transparent to other windows or bands. In specific examples, the detectable layer 26 utilizing such particles may selectively reflect light having a wavelength of about 905 nm or about 1550 nm (e.g., near-infrared radiation) to enhance reflectivity at wavelengths traditionally utilized by LIDAR systems.

According to another example, the detectable layer 26 may be configured to fluoresce at a predetermined wavelength in response to receiving an excitation emission. In such an example, the detectable layer 26 may include a binder and one or more types of organic molecules (e.g., a fluorescent component) with a structure configured to fluoresce when illuminated with specific wavelengths of light. According to various examples, the organic molecules may be based on a cyanine structure such as Cypate (e.g., cyanine component). It will be understood that other molecules and dyes capable of excitation and emission may be utilized without departing from the teachings provided herein. The excitation emission may have a wavelength in the ultraviolet, visible, near-infrared or infrared wavebands of the electromagnetic spectrum. In specific examples, the excitation emission may be of a wavelength used by LIDAR systems such as about 905 nm and/or about 1550 nm. In response to the excitation emission, the organic molecules may be configured to down convert the excitation emission into a longer wavelength emission. In a specific example, the organic molecules of the detectable layer 26 may be configured to be excited by an excitation emission from a LIDAR system and configured to emit light which is also perceptible by the LIDAR system (e.g., the organic molecules may fluoresce light in the near-infrared band). It will be understood that the reflective and fluorescent examples of the detectable layer 26 may be combined without departing from the teaching provided herein.

Use of the present disclosure may offer several advantages. First, enhanced reflectivity of the vehicle 10 to LIDAR systems may provide safety benefits. For example, the increased reflectivity may enhance the "visibility" of the vehicle 10 to autonomous vehicles, automated system and other system incorporating LIDAR systems. Further, examples of the vehicle 10 which have a small visible area, such as a motor cycle, may have improved visibility to autonomous vehicles. Second, as the detectable layer 26 may be substantially transparent to visible light, the underlying structures on which the detectable layer 26 is positioned on (e.g., the lighting assembly 22, windows 50 and/or license plate 18) may still be visible and/or allow light to pass through them as intended. Third, the ability to place the detectable layer 26 on "consumable" components which may not last the life of the vehicle 10, such as the license plate 18 and/or the lighting assembly 22, allows the detectable layer 26 to be applied to older model vehicles enabling vehicles already produced to enhance their reflectivity. Such an example may be advantageous in that it would allow older vehicles which may not be sufficiently reflective (e.g., due to color or design) to LIDAR to be visible to LIDAR systems by implementing a detectable layer 26 covered lighting assembly 22 or license plate 18.

It will be understood that although described in connection with vehicular components, the present disclosure may be equally applied to non-automotive components. For example, the detectable layer 26 of the present disclosure may be applied to signs, clothing, bicycles, hats, personal protective equipment, children's toys, pet leashes and harnesses, etc., without departing from the teachings provided herein. While the foregoing disclosure may be advantageous in allowing LIDAR systems to detect vehicles, application of the detectable layer 26 to the above enumerated items may allow for the detection of common road hazards (e.g., people, pets, bikers) by automated vehicles utilizing LIDAR detection systems.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. A vehicle comprising:
   a license plate positioned on the vehicle;
   a lighting assembly comprising a clear housing positioned on the vehicle; and
   a detectable layer positioned on the clear housing of the lighting assembly, wherein the detectable layer is configured to reflect at least one band of an electromagnetic spectrum and the detectable layer comprises at least one of a reflective component and a fluorescent component.

2. The vehicle of claim 1, wherein the detectable layer is configured to reflect the light within the infrared band of the electromagnetic spectrum.

3. The vehicle of claim 1, wherein the detectable layer is configured to reflect light within the near-infrared band of the electromagnetic spectrum.

4. The vehicle of claim 1, wherein the detectable layer is configured to receive an excitation emission and fluoresce in response to the excitation emission in a longer wavelength than the excitation emission.

5. The vehicle of claim 1, wherein the detectable layer is configured to reflect greater than or equal to about 50% of near-infrared light falling on the detectable layer.

6. A vehicle comprising:
   a lighting assembly comprising:
      a light source; and
      a substantially transparent housing, wherein the light source is positioned within the housing and configured to emit light through the housing; and
   a detectable layer positioned on an exterior surface of the housing, wherein the detectable layer comprises at least one of a reflective component and a fluorescent component.

7. The vehicle of claim 6, wherein the detectable layer is substantially transparent to visible light.

8. The vehicle of claim 6, wherein the detectable layer comprises:
   a dielectric material and a metal.

9. The vehicle of claim 8, wherein the dielectric material comprises $TiO_2$ and the metal is a dopant disposed within a matrix of the dielectric material.

10. The vehicle of claim 9, wherein the metal comprises at least one of gold, niobium and copper.

11. The vehicle of claim 8, wherein the detectable layer comprises a stack of alternating refractive index materials.

12. The vehicle of claim 11, wherein the dielectric material comprises at least one of $SiO_2$, $TiO_2$ and $MgF_2$.

13. A vehicle comprising:
   an exterior component of the vehicle; and
   a detectable layer disposed on the exterior component, wherein the detectable layer is configured to fluoresce near-infrared light in response to an excitation emission and is substantially transparent to visible wavelengths of light.

14. The vehicle of claim 13, wherein the detectable layer comprises a cyanine component.

15. The vehicle of claim 14, wherein the excitation emission has a wavelength between about 700 nm and about 1600 nm.

16. The vehicle of claim 15, wherein the fluorescence of near-infrared light is at a longer wavelength than the excitation emission.

17. The vehicle of claim 16, wherein the exterior component is a light assembly or a license plate.

* * * * *